(12) United States Patent
Heigl et al.

(10) Patent No.: US 6,265,936 B1
(45) Date of Patent: Jul. 24, 2001

(54) INTEGRATED AMPLIFIER ARRANGEMENT

(75) Inventors: Franz Heigl, Ochsenfeld; Axel Wicha, Heilbronn, both of (DE)

(73) Assignees: Vishay Semiconductor GmbH, Vishay-Heilbronn; Microtune GmbH & Co. KG, Microtune-Ingostad, both of (DE)

( * ) Notice: Subject to any disclaimer, the term of this patent is extended or adjusted under 35 U.S.C. 154(b) by 0 days.

(21) Appl. No.: 09/450,275

(22) Filed: Nov. 26, 1999

(30) Foreign Application Priority Data

Nov. 27, 1998 (DE) ............................... 198 54 847

(51) Int. Cl.[7] ...................................... H03F 1/14
(52) U.S. Cl. .................. 330/51; 330/124 R; 330/254; 330/285
(58) Field of Search ................ 330/51, 124 R, 330/254, 285

(56) References Cited

U.S. PATENT DOCUMENTS 3,525,050 * 8/1970 Wolf et al. ............................. 330/51
4,631,490 * 12/1986 Takahashi ............................... 330/51
4,829,263 * 5/1989 Gulczynski ............................. 330/51
5,008,631 * 4/1991 Scherer et al. ..................... 330/124 R
5,621,353 * 4/1997 Botti et al. ............................ 330/51
6,160,447 * 12/2000 Huang .................................... 330/51

FOREIGN PATENT DOCUMENTS 2 289 810    11/1995 (GB).

\* cited by examiner

*Primary Examiner*—Michael B. Shingleton
(74) *Attorney, Agent, or Firm*—Venable; Norman N. Kunitz

(57) ABSTRACT

In the field of telecommunications, there is frequently a need to deactivate two amplifier stages alternately. In order to do this, the amplifier stages are usually triggered in push-pull mode over separate control lines. Such control lines allow the undesired coupling-in of interference in the amplifier stages and in following circuit elements, particularly in high-frequency applications. The new amplifier arrangement enables two amplifier stages to be alternately deactivated and has a high degree of immunity to high-frequency interference. It is realized as an integrated circuit and has, alongside the two amplifier stages, a switching stage over which the one of the two amplifier stages can be low-resistance linked on the input end to a reference potential connection having reference potential and can be deactivated through this. The one amplifier stage is thereby preferably low-resistance linked to the reference potential connection if the input voltage available at the amplifier input of the other amplifier stage has a d. c. voltage working point, with which this other amplifier stage is activated.

16 Claims, 2 Drawing Sheets

INTEGRATED AMPLIFIER ARRANGEMENT

BACKGROUND OF THE INVENTION

In the field of telecommunications, there is frequently a need to deactivate two amplifier stages alternately. In order to do this, the amplifier stages are usually triggered in push-pull mode over separate control lines. Such control lines allow the undesired coupling-in of interference in the amplifier stages and in following circuit elements, particularly in high-frequency applications.

SUMMARY OF THE INVENTION

The object of the invention is to provide an amplifier arrangement with two alternately deactivatable amplifier stages which can be manufactured economically and have a high degree of immunity to high-frequency interference.

This task is solved by the features in patent claim 1. Advantageous embodiments and developments ensue from the subclaims.

The invention is based on the recognition that amplifier stages can be switched into an inactive state through a low-resistance connection of their amplifier inputs to a reference potential connection, i.e. by short-circuiting the amplifier inputs to the reference potential. According to the invention, two amplifier stages, each with an amplifier input, and a switching stage over which the amplifier inputs of the amplifier stages are linked to one another, are integrated in a switching circuit to form an integrated amplifier arrangement. In the case of this amplifier arrangement, the amplifier input of the second amplifier stage is low-resistance linked to the reference potential connection via the switching stage according to a first input voltage available at the amplifier input of the first amplifier stage, preferably according to the d. c. voltage working point of the first input voltage, and thereby short-circuited to a reference potential, for example to a ground potential. The second amplifier stage is deactivated in this way.

The amplifier input of the second amplifier stage is preferably short-circuited to the reference potential if the first input voltage has a d. c. voltage working point with which the first amplifier stage is activated, i.e. if the amplifier input of the first amplifier stage is not short-circuited via external switching means to reference potential and the d.c. voltage working point of the first input voltage is thereby greater than a defined switching threshold. If, on the other hand, the amplifier input of the first amplifier stage is short-circuited to reference potential, then the d.c. voltage working point of the first input voltage lies below the defined switching threshold and the first amplifier stage is thereby deactivated. In this case, the amplifier input of the second amplifier stage is decoupled from the amplifier input of the first amplifier stage, i.e. the deactivation of the second amplifier stage is canceled.

The significant advantages of the amplifier arrangement according to the invention lie in the fact that no separate connections are required for alternately deactivating the amplifier stages, that the switching stage can be manufactured with a small number of components which can be integrated in a simple manner—the short-circuiting of the amplifier input of the second amplifier stage is preferably achieved via a switch, realized as a field-effect transistor for example—, that it has small dimensions on account of the low number of connections and circuit elements and therefore requires little space on a printed circuit board, and that it can be wired with a small number of lines, which represents an important advantage, particularly in high-frequency applications, for example in television tuners, because a short wiring routing is possible on account of the low number of external lines, through which the coupling-in of high-frequency interference is avoided.

In an advantageous development of the amplifier arrangement according to the invention, the switching stage can also be triggered via the amplifier input of the second amplifier stage—for this purpose the switching stage preferably has a further switch realized as a field-effect transistor—so that the amplifier input of the first amplifier stage is short-circuited to reference potential via the switching stage according to the d.c. voltage working point of a second input voltage available at the amplifier input of the second amplifier stage. The user then has the option to select that one of the amplifier inputs for deactivating the amplifier stages which, given the wiring of the amplifier arrangement, enables the shortest possible wiring routing and without or with the least possible number of crossings.

In an advantageous embodiment of the amplifier arrangement, each of the two amplifier stages has an amplifier transistor realized as a field-effect transistor which is operated in common source mode, and which preferably has two gate electrodes, of which the first is linked to the amplifier input of the respective amplifier stage and the second is linked to an automatic gain control connection over which the amplification or transconductance of the respective amplifier transistor can be controlled. The significant advantage of the amplifier transistors operated in common source mode lies in the fact that these are disabled when the amplifier inputs are short-circuited, so that no current flows in the amplifier stages in the deactivated state.

The amplifier arrangement is best suited for use in high-frequency circuits, particularly in television tuners in which one of two input signals with different frequencies is selected for further processing and in each case one of two signal branches matched to the frequency of the input signals is amplified.

DESCRIPTION OF THE PREFERRED EMBODIMENTS

The invention is described below in more detail by means of embodiments with reference to the figures.

Figure 1:
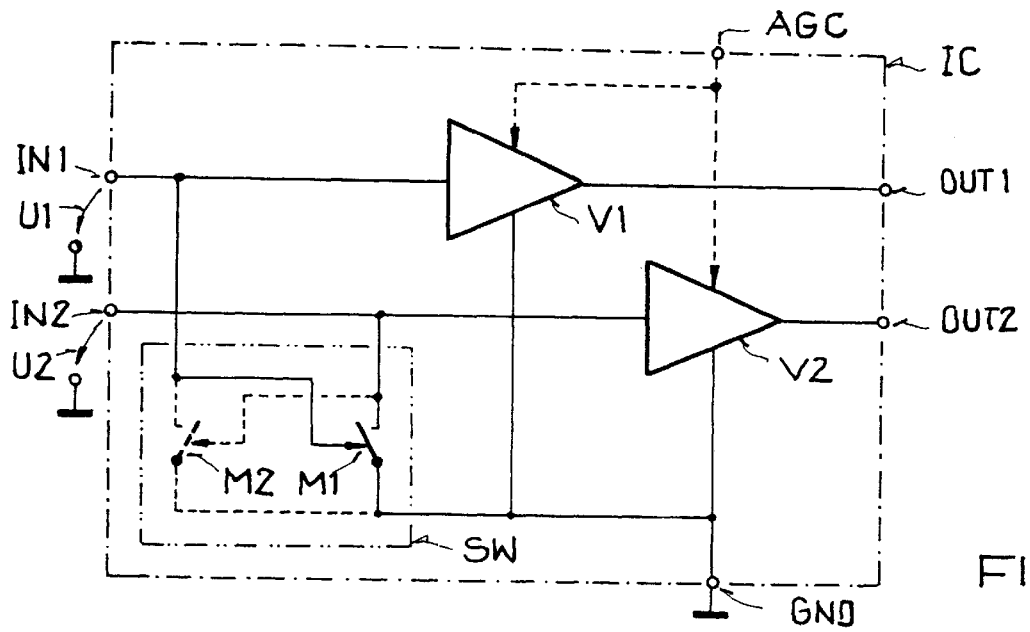
FIG. 1 A basic representation of the amplifier arrangement according to the invention, FIG. 2 A first embodiment of the amplifier arrangement from FIG. 1, FIG. 3 A second embodiment of the amplifier arrangement from FIG. 1.

In accordance with FIG. 1, the integrated amplifier arrangement IC according to the invention comprises two amplifier stages V1, V2 each with an amplifier input IN1 and IN2, each an amplifier output OUT1 and OUT2 and each one with a connection linked to a reference potential connection GND, at which a reference potential, for example ground potential, is available, and a switching stage SW linked to the amplifier inputs IN1, IN2. The amplifier stages V1, V2 can further each have a connection linked to an automatic gain control connection AGC for amplification control purposes.

The switching stage SW has a switch M1, whose control connection is linked to the amplifier input IN1 of the first amplifier stage V1, and the amplifier input IN2 of the second amplifier stage V2 is linked to the reference potential connection over its switching path.

At the amplifier input IN1 of the first amplifier stage V1, a d. c. voltage working point occurs dependent upon an internal wiring of the amplifier stage V1 and possibly upon an external wiring. A high-frequency signal, which is to be amplified, is superimposed on this working point to form a first input voltage U1. The d. c. voltage working point at the amplifier input IN1, i.e. the d. c. voltage component of the first input voltage U1 available between the amplifier input IN1 and the reference potential, is greater than a defined switching threshold of the switch M1 if the amplifier input IN1 is not short-circuited to reference potential via external circuit means. The amplifier input IN2 of the second amplifier stage V2 is then short-circuited to reference potential over the switching path of the switch M1, so that a d. c. voltage working point substantially the same as the reference potential occurs at the amplifier input IN2 whereby the second amplifier stage V2 is inactive. A high-frequency signal fed to the amplifier input IN2 then bypasses the amplifier stage V2 via the switch M1 and is therefore not amplified. Correspondingly, a d. c. voltage working point substantially the same as the reference potential occurs at amplifier input IN1 if this is short-circuited to reference potential via external circuit means, so that the first amplifier stage V1 is deactivated and the switching path of the switch M1 is opened. At the amplifier input IN2, a d. c. voltage working point therefore occurs dependent upon the internal wiring of the amplifier stage V2 and possibly upon an external wiring whereby the second amplifier stage V2 is active. The second input voltage U2, composed of a d. c. voltage component and a high-frequency component, available at the amplifier input IN2, is therefore amplified in the second amplifier stage V2.

The switching stage SW can, as the dotted line in FIG. 1 shows, also have a further switch M2, whose control connection is linked to the amplifier input IN2 of the second amplifier stage V2 and the amplifier input IN1 of the first amplifier stage V1 is linked to the reference potential connection GND via its switching path. The amplifier stages V1, V2 can then be deactivated either via the amplifier input IN1 or via the amplifier input IN2, which is advantageous for the user when wiring the amplifier arrangement IC.

Figure 2:
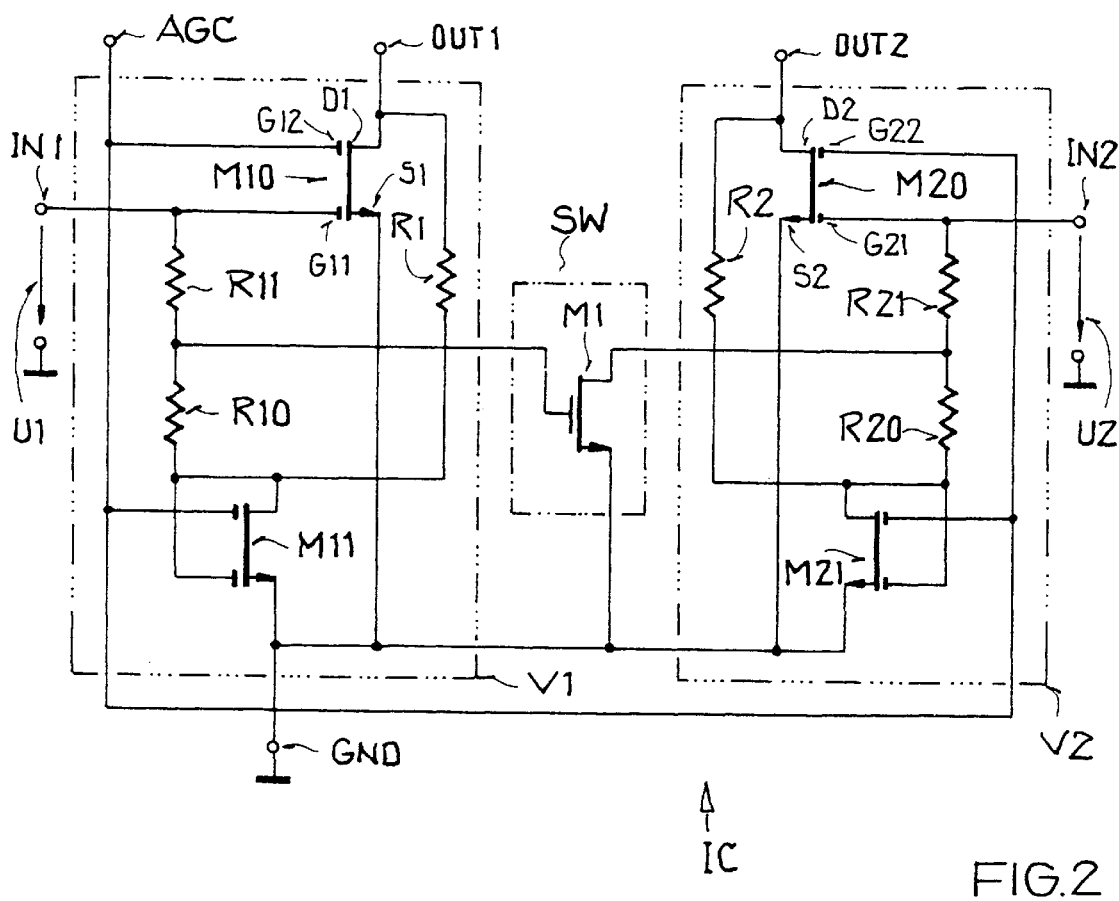

In accordance with FIG. 2, the amplifier stages V1, V2 each have an amplifier transistor M10 and M20 as an amplifying element and each a biasing transistor M11 and M21 for setting the working point. The amplifier transistors M10, M20 and biasing transistors M11, M21 are here each realized as field-effect transistors with two gate electrodes, of which the first forms, in each case, a signal input and the second, in each case, a control input for controlling the transconductance of the respective field-effect transistors M10 and M20 and M11 and M21. The amplifier transistor M10 of the first amplifier stage V1 is here linked with its first gate electrode G11 to the amplifier input IN1, with its second gate electrode G12 to the automatic gain control connection AGC, with its source electrode S1 to the reference potential connection GND and with its drain electrode D1 to the amplifier output OUT1, and the biasing transistor M11 of the first amplifier stage V1 is linked with its drain electrode to the amplifier output OUT1 via the resistor R1 and to the amplifier input IN1 via the resistors R10, R11, as well as linked with its first gate electrode to its drain electrode, with its second gate electrode to the automatic gain control connection AGC and with its source electrode to the reference potential connection GND.

Correspondingly, the amplifier transistor M20 of the second amplifier stage V2 is linked with its first gate electrode G21 to the amplifier input IN2, with its second gate electrode G22 to the automatic gain control connection AGC, with its source electrode S2 to the reference potential connection GND and with its drain electrode D2 to the amplifier output OUT2, and the biasing transistor M21 of the second amplifier stage V2 is linked with its drain electrode to the amplifier output OUT2 via the resistor R2 and to the amplifier input IN2 via the resistors R20, R21, as well as linked with its first gate electrode to its drain electrode, with its second gate electrode to the automatic gain control connection AGC and with its source electrode to the reference potential connection GND.

The amplifier outputs OUT1, OUT2 are accordingly realized as so-called open-drain connections, i.e. the amplifier stages V1, V2 are supplied with current via the external wiring of the amplifier outputs OUT1, OUT2 which is not shown in FIG. 2. The significant advantage of the amplifier transistors M10, M20 operated in common source mode lies in the fact that their threshold voltages can be selected in such a way that they are disabled when amplifier inputs IN1, IN2 are short-circuited, and therefore no current flows in the amplifier stages V1, V2 in the deactivated state and also that no high-frequency signal components possibly still available at the amplifier inputs IN1, IN2 are amplified.

The switch M1 is realized as a field-effect transistor in the same way as the amplifying and biasing transistors. It is linked with its gate electrode to the amplifier input IN1 of the first amplifier stage V1 via the resistor R11, with its drain electrode to the amplifier input IN2 of the second amplifier stage V2 via the resistor R21 and with its source electrode to the reference potential connection GND. The resistors R11 and R21 serve here for the high-frequency decoupling of the switch M1 from the amplifier inputs IN1 and IN2.

The biasing transistors M11 and M21 are high-frequency decoupled from the amplifier outputs OUT1 and OUT2 and the amplifier inputs IN1 and IN2 via the resistors R1, R10 and R2, R20. The biasing transistors M11, M12 are therefore substantially only triggered by the d. c. voltage components of the voltages available at the respective amplifier inputs IN1 and IN2 and the respective amplifier outputs OUT1 and OUT2. They counteract a rise of the d. c. voltage components of the voltages available at the amplifier outputs OUT1, OUT2 by shunting a larger current from the respective amplifier inputs IN1 and IN2 to the reference potential connection GND and therefore effect a stabilization of the working points of the amplifier stages V1, V2.

Figure 3:
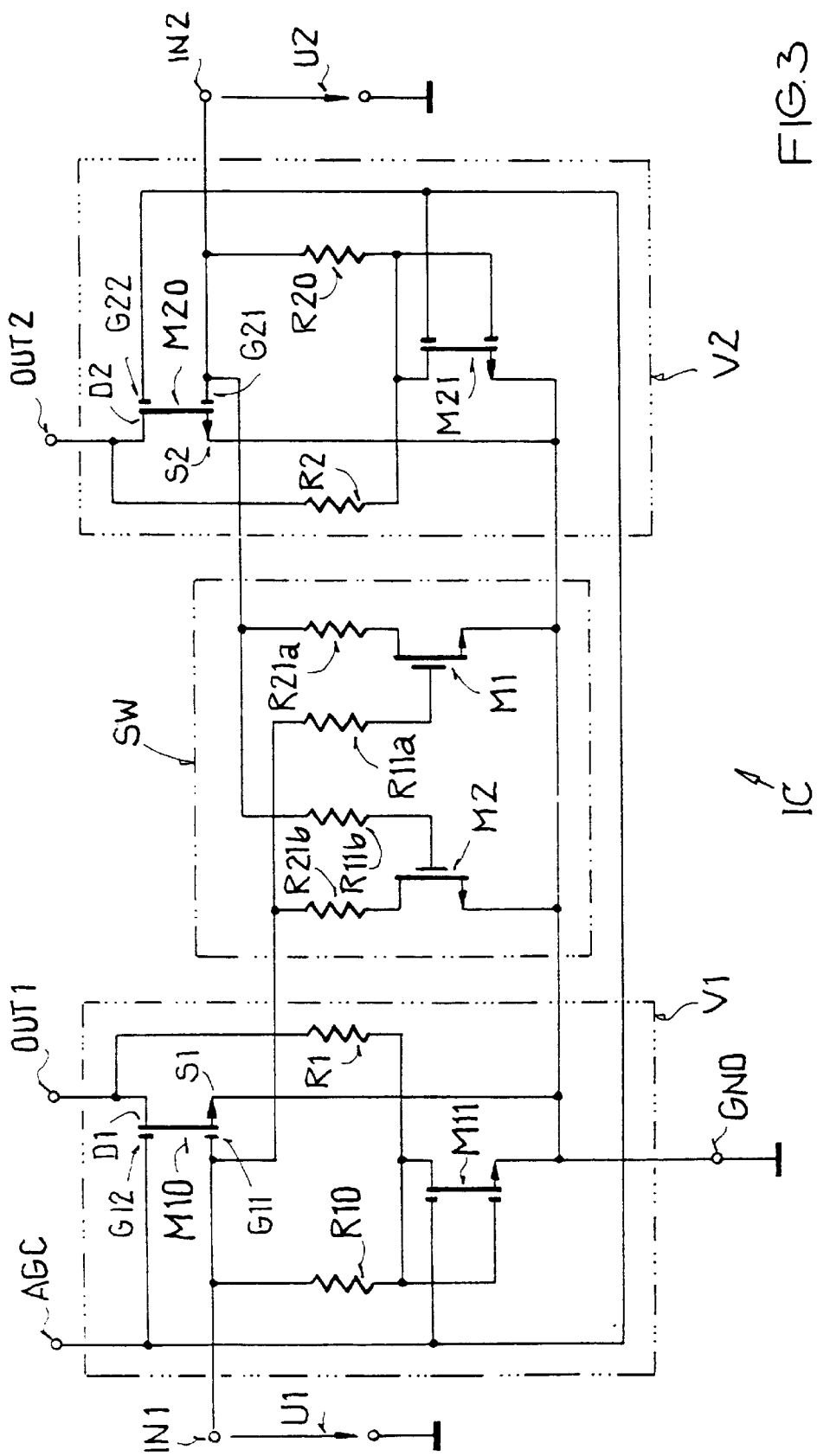

The amplifier arrangement shown in FIG. 3 differs from that in FIG. 2 in that the biasing transistors M11, M21 are only linked to the respective amplifier inputs IN1 and IN2 via the resistors R10 and R20 at the drain end, that the switching stage SW has a further switch i.e. the field-effect transistor M2, which is linked at the gate end to the amplifier input IN2 of the second amplifier stage V2, at the drain end to the amplifier input IN1 of the first amplifier stage V1 and at the source end to the reference potential connection GND, and that the field-effect transistors M1 and M2 have resistors R21$a$, R21$b$ in their drain branches for limiting the currents flowing through them and resistors R11$a$, R11$b$ in their gate branches for the high-frequency decoupling of their gate electrodes from the respective amplifier inputs IN1, IN2. The resistors R11$a$ and R21$a$ correspond here to the resistors R11 and R21 in FIG. 2. The additional field-effect transistor M2, which corresponds to the switch M2 shown in FIG. 1 with a dotted line, enables the additional alternative of deactivating the amplifier stages via the amplifier input IN2. The threshold voltages of the two field-effect transistors M1, M2 are here advantageously selected somewhat lower than those of the amplifier transistors M10, M20.

All the field-effect transistors in the amplifier arrangements IC shown in FIGS. 2 and 3 have n-type conductivity; they are preferably realized as n-channel MOS-transistors and can be integrated in a circuit with little technological effort.

What is claimed is:

1. Integrated amplifier arrangement with a first and a second amplifier stage (V1, V2) each with an amplifier input (IN1, IN2) and with a switching stage (SW) linked to the amplifier inputs (IN1, IN2) of the amplifier stages (V1, V2) over which the amplifier input (IN2) of the second amplifier stage (V2) can be low-resistance linked, according to a first input voltage (U1) available at the amplifier input (IN1) of the first amplifier stage (V1), to a reference potential connection (GND) having reference potential.

2. Integrated amplifier arrangement according to claim 1 wherein the amplifier input (IN2) of the second amplifier stage (V2) is low-resistance linked to the reference potential connection (GND) if the first input voltage (U1) has a d. c. voltage working point with which the first amplifier stage (V1) is activated.

3. Integrated amplifier arrangement according to claim 2 wherein the switching stage (SW1) has a switch (M1) with a control electrode linked to the amplifier input (IN1) of the first amplifier stage (V1) and with a switching path over which the amplifier input (IN2) of the second amplifier stage (V2) is linked to a reference potential connection (GND) having reference potential.

4. Integrated amplifier arrangement according to claim 3 wherein the switch (M1) of the switching stage (SW) is realized as a field-effect transistor which is linked at the gate end to the amplifier input (IN1) of the first amplifier stage (V1), at the drain end to the amplifier input (IN2) of the second amplifier stage (V2) and at the source end to the reference potential connection (GND).

5. Integrated amplifier arrangement according to claim 3 wherein the switching stage (SW) has a further switch (M2) with a control electrode linked to the amplifier input (IN2) of the second amplifier stage (V2) and with a switching path over which the amplifier input (IN1) of the first amplifier stage (V1) is linked to the reference potential connection (GND).

6. Integrated amplifier arrangement according to claim 5 wherein the switches (M1, M2) of the switching stage (SW) are realized as field-effect transistors, and wherein a switch (M1) of the switching stage (SW) is linked at the gate end to the amplifier input (IN1) of the first amplifier stage (V1), at the drain end to the amplifier input (IN2) of the second amplifier stage (V2) and at the source end to the reference potential connection (GND) and the further switch (M2) of the switching stage (SW) is linked at the gate end to the amplifier input (IN2) of the second amplifier stage (V2), at the drain end to the amplifier input (IN1) of the first amplifier stage (V1) and at the source end to the reference potential connection (GND).

7. Integrated amplifier arrangement according to claim 4 wherein the amplifier stages (V1, V2) each have an amplifier transistor (M10, M20) realized as a field-effect transistor in common source mode as an amplifying element.

8. Integrated amplifier arrangement according to claim 7 wherein the amplifier transistor (M10, M20) of each amplifier stage (V1, V2) has a first gate electrode (G11, G21) linked to the amplifier input (IN1, IN2) of the respective amplifier stage (V1, V2), a second gate electrode (G12, G22) linked to an automatic gain control connection (AGC), a source electrode (S1, S2) linked to the reference potential connection (GND) and a drain electrode (D1, D2) linked to an amplifier output (OUT1, OUT2) of the respective amplifier stage (V1, V2).

9. Integrated amplifier arrangement according to claim 8 wherein each amplifier stage (V1, V2) has for the setting of the working point a biasing transistor (M11, M21) realized as a field-effect transistor with a drain electrode linked to the amplifier output (OUT1, OUT2) and the amplifier input (IN1, IN2) of the respective amplifier stage (V1, V2) via resistors (R1, R10, R2, R20), a first gate electrode linked to its drain electrode and a source electrode linked to the reference potential connection (GND).

10. Integrated amplifier arrangement according to claim 9 wherein the biasing transistors (M11, M21) each have a second gate electrode linked to the automatic gain control connection (AGC).

11. Integrated amplifier arrangement according to claim 10 wherein the field-effect transistors (M1, M2, M10, M11, M20, M21) are realized as n-channel transistors.

12. Integrated amplifier arrangement according to claim 6 wherein the amplifier stages (V1, V2) each have an amplifier transistor (M10, M20), realized as a field-effect transistor, as an amplifying element operated in common source mode.

13. Integrated amplifier arrangement according to claim 12 wherein the amplifier transistor (M10, M20) of each amplifier stage (V1, V2) has a first gate electrode (G11, G21) linked to the amplifier input (IN1, IN2) of the respective amplifier stage (V1, V2), a second gate electrode (G12, G22) linked to an automatic gain control connection (AGC), a source electrode (S1, S2) linked to the reference potential connection (GND) and a drain electrode (D1, D2) linked to an amplifier output (OUT1, OUT2) of the respective amplifier stage (V1, V2).

14. Integrated amplifier arrangement according to claim 13 wherein each amplifier stage (V1, V2) has, for the setting of the working point, a biasing transistor (M11, M21) realized as a field-effect transistor with a drain electrode linked to the amplifier output (OUT1, OUT2) and the amplifier input (IN1, IN2) of the respective amplifier stage (V1, V2) via resistors (R1, R10, R2, R20), a first gate electrode linked to its drain electrode and a source electrode linked to the reference potential connection (GND).

15. Integrated amplifier arrangement according to claim 14 wherein the biasing transistors (M11, M21) each have a second gate electrode linked to the automatic gain control connection (AGC).

16. Integrated amplifier arrangement according to claim 15 wherein the field-effect transistors (M1, M2, M10, M11, M20, M21) are realized as n-channel transistors.

* * * * *